(12) United States Patent
Richardson

(10) Patent No.: US 6,914,350 B2
(45) Date of Patent: Jul. 5, 2005

(54) SWITCHING ARRANGEMENT

(75) Inventor: Robert Richardson, Chelmsford (GB)

(73) Assignee: Marconi Applied Technologies Limited, London (GB)

( * ) Notice: Subject to any disclaimer, the term of this patent is extended or adjusted under 35 U.S.C. 154(b) by 379 days.

(21) Appl. No.: 09/725,175

(22) Filed: Nov. 29, 2000

(65) Prior Publication Data

US 2001/0038247 A1 Nov. 8, 2001

(30) Foreign Application Priority Data

Nov. 29, 1999 (GB) .............................. 9928074

(51) Int. Cl.$^7$ ................................. H03K 3/00
(52) U.S. Cl. ........................... 307/106; 307/139
(58) Field of Search ................. 307/125, 113, 307/106, 139; 336/174, 175, 176, 211, 221; 363/68; 323/271; 313/324; 340/310.07, 310.08

(56) References Cited

U.S. PATENT DOCUMENTS

| | | | | |
|---|---|---|---|---|
| 3,600,665 A | * | 8/1971 | Pelly et al. | 323/321 |
| 3,603,887 A | * | 9/1971 | Doss et al. | 327/301 |
| 3,611,106 A | * | 10/1971 | Mooney et al. | 363/68 |
| 3,717,808 A | * | 2/1973 | Horna | 323/305 |
| 3,889,175 A | * | 6/1975 | Isogai et al. | 363/68 |
| 4,370,607 A | * | 1/1983 | Dassonville | 313/324 |
| 4,390,813 A | * | 6/1983 | Stanley | 315/248 |
| 4,529,888 A | * | 7/1985 | Fleischer | 327/458 |
| 4,535,400 A | * | 8/1985 | Itani | 363/68 |
| H275 H | * | 5/1987 | Milberger et al. | 327/109 |
| 4,745,391 A | * | 5/1988 | Gajjar | 340/310.07 |
| 4,777,406 A | * | 10/1988 | Ross et al. | 363/68 |
| 5,070,441 A | * | 12/1991 | Ashley | 363/154 |
| 5,530,385 A | * | 6/1996 | Miettinen | 327/108 |
| 5,684,426 A | * | 11/1997 | De Doncker | 324/440 |
| 5,763,962 A | | 6/1998 | Tsurumi | |
| 5,975,756 A | * | 11/1999 | Jones | 374/141 |
| 6,246,598 B1 | * | 6/2001 | Tarter et al. | 363/56.01 |
| 6,462,605 B1 | * | 10/2002 | Hanks | 327/438 |

FOREIGN PATENT DOCUMENTS

| | | |
|---|---|---|
| EP | 0 592 302 A1 | 4/1993 |
| EP | 0 724 332 A1 | 7/1996 |
| EP | 0 782 266 A1 | 7/1997 |
| GB | 2 341 288 | 3/2000 |

OTHER PUBLICATIONS

McMillman and Taub, "Pulse, Digital, and Switching Waveforms", 1965, pp. 86–89, McGraw–Hill.

J. Millman and H. Taub, Pulse, Digital, and Switching Waveforms. New York: McGraw Hill, 1965, pp. 85–90.

L.A. Moxon, HF Antennas for all Locations. Radio Society of Great Britain, 1993, p. 234.

M. Kaufman and A.H. Seidman, Handbook of Electronics Calculations. New York: McGraw Hill, 1979, Sections 18.3–18.4.

* cited by examiner

Primary Examiner—Robert L. DeBeradinis
(74) Attorney, Agent, or Firm—Venable LLP; Robert Kinberg; Jeffrey W. Gluck

(57) ABSTRACT

A solid state switching arrangement includes a transmission line which acts as a primary transformer loop and acts with secondary windings carried by switching modules to apply triggering signals to the switches. The arrangement may include greater than sixty modules.

30 Claims, 3 Drawing Sheets

SWITCHING ARRANGEMENT

FIELD OF THE INVENTION

This invention relates to a switching arrangement and more particularly to a switching arrangement involving solid state switches.

BACKGROUND TO THE INVENTION

It has previously proposed to connect together a plurality of solid state switches, in series or in parallel, to enable a high voltage output pulse to be obtained. Each solid state switch is included in a module carrying circuitry for the application of trigger (or control) signals to the switch and also for the provision of an LT power supply. Several tens of such modules may be stacked together to provide the required high voltage output.

The present invention arose from the consideration of in what way triggering signals may be applied to solid state switches where a large number of switching modules are involved, However, the invention is also applicable to switching arrangements having less onerous voltage isolation requirements.

SUMMARY OF THE INVENTION

According to the invention, there is provided a switching arrangement comprising a plurality of modules, to each of which energy and/or trigger signals are to be applied, each module carrying two current transformer secondary windings and there being a primary transformer loop in the form of a transmission line which is common to each module and which couples with the two transformer windings of each module.

In a preferred embodiment, the arrangement provides combined triggering and local LT via a single current path, that is, via the transmission line, but the invention may be also usefully applied where only one of these signals is to be applied to the module via the transmission link.

The transmission line ideally is matched but it is possible that useful operation may still be achieved where there is a slight mismatch.

A discussion of use of a transmission line to transmit a signal may be found at pages 86–90 of "Pulse, Digital, and Switching Waveforms" by Millman and Taub, McGraw-Hill 1965, incorporated herein by reference. By using a transmission line to allow the energy and trigger signals to be applied to the modules, the inductance in the circuit manifests itself as a fixed and small delay. This contrasts with previous suggested arrangements in which power is supplied to modules via a primary transformer winding consisting of a simple inductive loop, which arrangement exhibits a significant, current rise time limiting inductance. By the using the invention, a delay over a transmission line length of, say, 1 metre should be less than 4 nanoseconds or so.

Another advantage arising from the invention is that common mode displacement currents partially cancel at the two transformer windings on each module, thus reducing the risk of these currents interfering with a trigger signal and possibly causing false triggering.

The invention is particularly applicable to switching arrangements having a large number of stacked modules, in the region of 60 or more, where high voltage isolation is required. However, it may also be used for smaller stacks, In one preferred embodiment, the two current transformer secondary windings on a module have an equal number of turns of opposite sense and are connected in parallel. In an alternative arrangement, two windings of half value in series may be used.

Advantageously, the transmission line includes a load resistor. This enables the characteristic impedance to be matched to prevent ringing and other undesirable effects which could lead to signal distortion. In a preferred arrangement, the load resistance is located at substantially the mid-point of the transmission line. However, it has been found that alternatively, the load resistor may be placed near an end of the transmission line as still be effective. Advantageously, a by-pass diode is connected in parallel with the load resistor.

In one embodiment of the invention, means are included for transmitting a current from one source along the transmission line to provide power for local low tension on each module and from another source along the transmission line to apply triggering pulses to the modules. The current applied from one source may be in the opposite direction along the transmission line to that applied from the other source. This arrangement is advantageous as it permits each current source to be tailored for its intended use.

In a particularly advantageous embodiment, electrostatic shielding is provided around part of the length of the transmission line. This may take the form of a cylindrical conductor or mesh around the transmission line, preventing damage to elements of the circuit located in the vicinity of the transmission line. Preferably, the electrostatic shielding includes a break at substantially the mid-point of the transmission line. A resistive load or loads may be connected to the electrostatic shielding and thus any displacement currents are diverted into the resistive loads. By ensuring that these resistors match the characteristic impedance of the structure formed by the electrostatic screen and the transmission line, any current will be dissipated during the switching edges without further ringing. Where the electrostatic shielding includes a break, a separate resistor may be connected to each part of the shielding, or alternatively a common resistor attached to both in parallel may be employed.

BRIEF DESCRIPTION OF THE DRAWINGS

One way in which the invention may be performed is now described by way of example with reference to the accompanying drawings in which.

DESCRIPTION OF PREFERRED EMBODIMENTS

Figure 1:
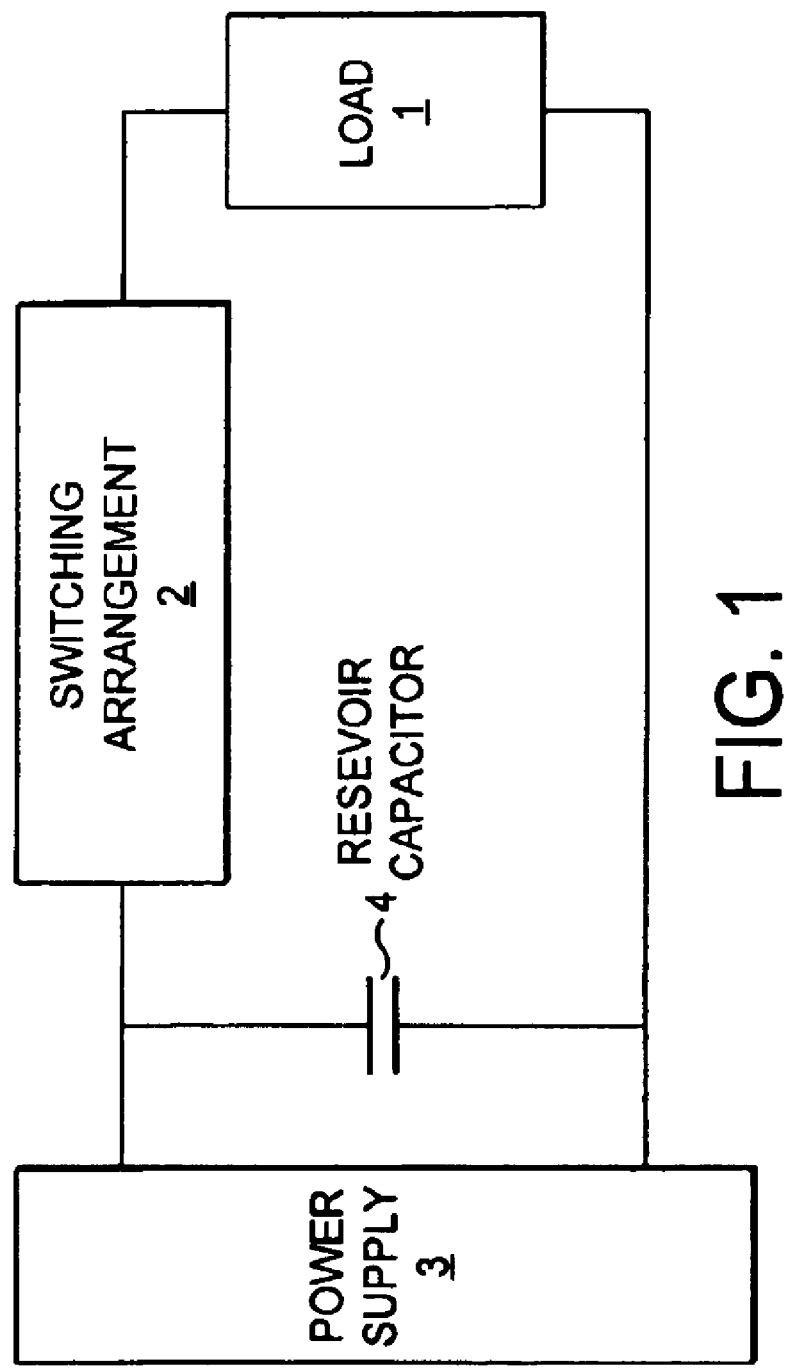
FIG. 1 is a schematic block diagram of an apparatus employing a switching arrangement in accordance with the invention.

With reference to FIG. 1, an apparatus for applying pulses to a load 1 utilises a switching arrangement 2 comprising a plurality of solid state switches, each switch being included in a module and the modules being assembled in a stacked arrangement. The switching arrangement 2 is connected to a power supply 3 and a reservoir capacitor 4 is connected across the switching arrangement 2 and load 1.

Figure 2:
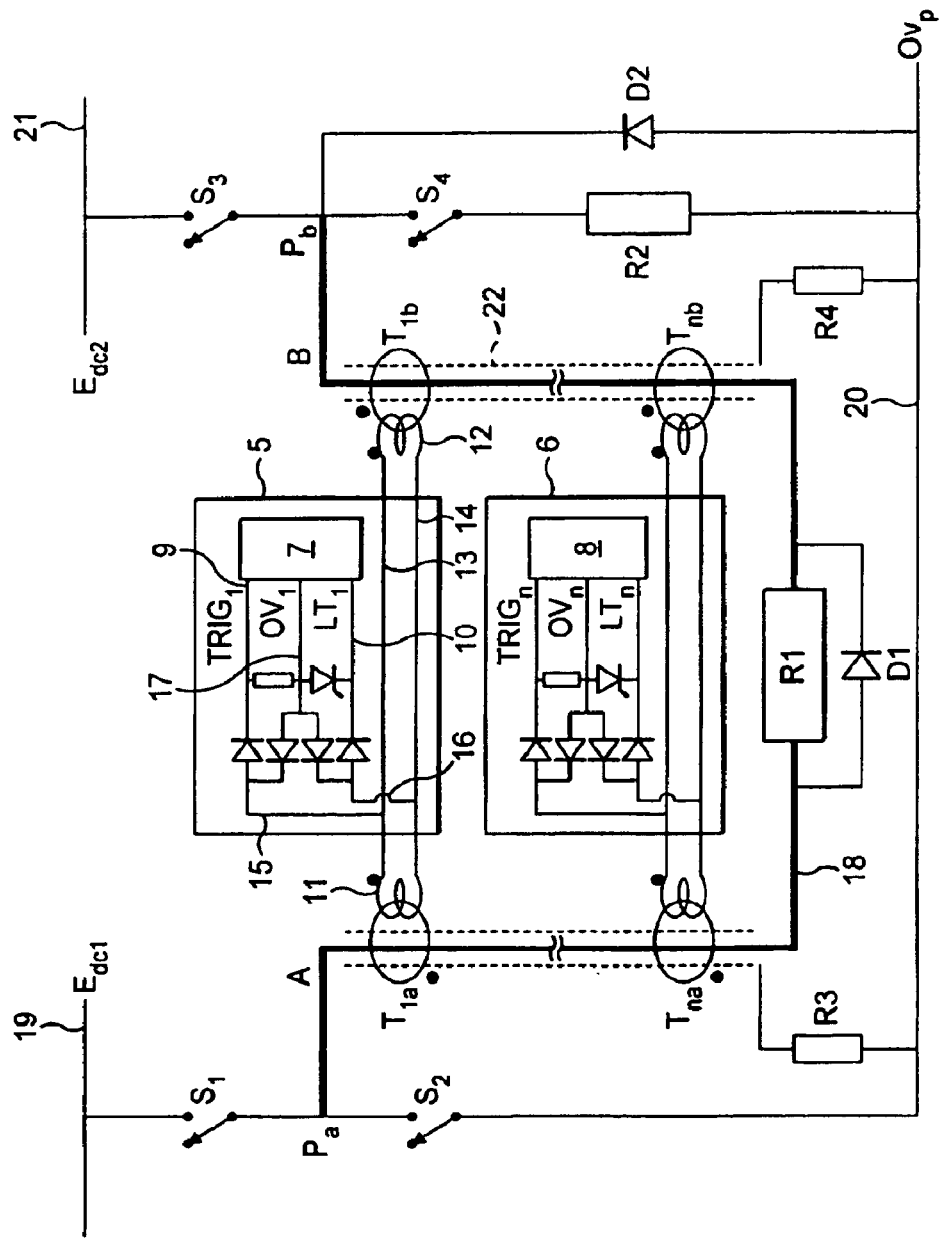
FIG. 2 is a schematic circuit diagram of a switching arrangement in accordance with the invention.

With reference to FIG. 2, each solid state switch of the arrangement 2 is carried by an associated module, two of which 5 and 6 are shown, these solid state switches being represented as blocks at 7 and 8. In this particular arrangement, the stack comprises 60 or more nominally identical modules, and the switches 7 and 8 are power FETs.

With reference to module 5, a triggering signal is applied on a line 9 to the switch 7 to control its on/off state and in addition, there is an LT supply 10 also applied to the switch 7. The module includes two secondary windings 11 and 12 of a current transformer which are wound in opposite directions and connected by lines 13 and 14 from which connections are made via 15 and 16 in a split bridge configuration to the triggering line 9 and LT and earth connection 10 and 17.

The primary loop of the current transformer consists of a coaxial transmission line 18 which is arranged to couple with the secondary windings 11 and 12 carried by each of the modules. The transmission line 18 passes through one of each pair of secondary windings carried by each module in turn along the stack and then returns to couple with the remaining winding of each pair carried by each of the modules. The transmission line may be referred to as a symmetrical twin line.

At approximately the mid-point of the transmission line 18, a resistor R1 is included to ensure matching of the transmission line to prevent reflections along it which could degrade performance of the arrangement. The resistor R1 is connected in parallel with a diode D1.

The arrangement includes four FETs S1, S2, S3 and S4. These are arranged such that when S1 and S4 are closed there is a connection from one rail Edc1 19 via the transmission line 18 to ground at 20. In an alternative switching configuration, the switches S3 and S2 are closed to provide a path via the transmission line 18 from a second voltage rail Edc2 21 to ground at 20.

Figure 3:
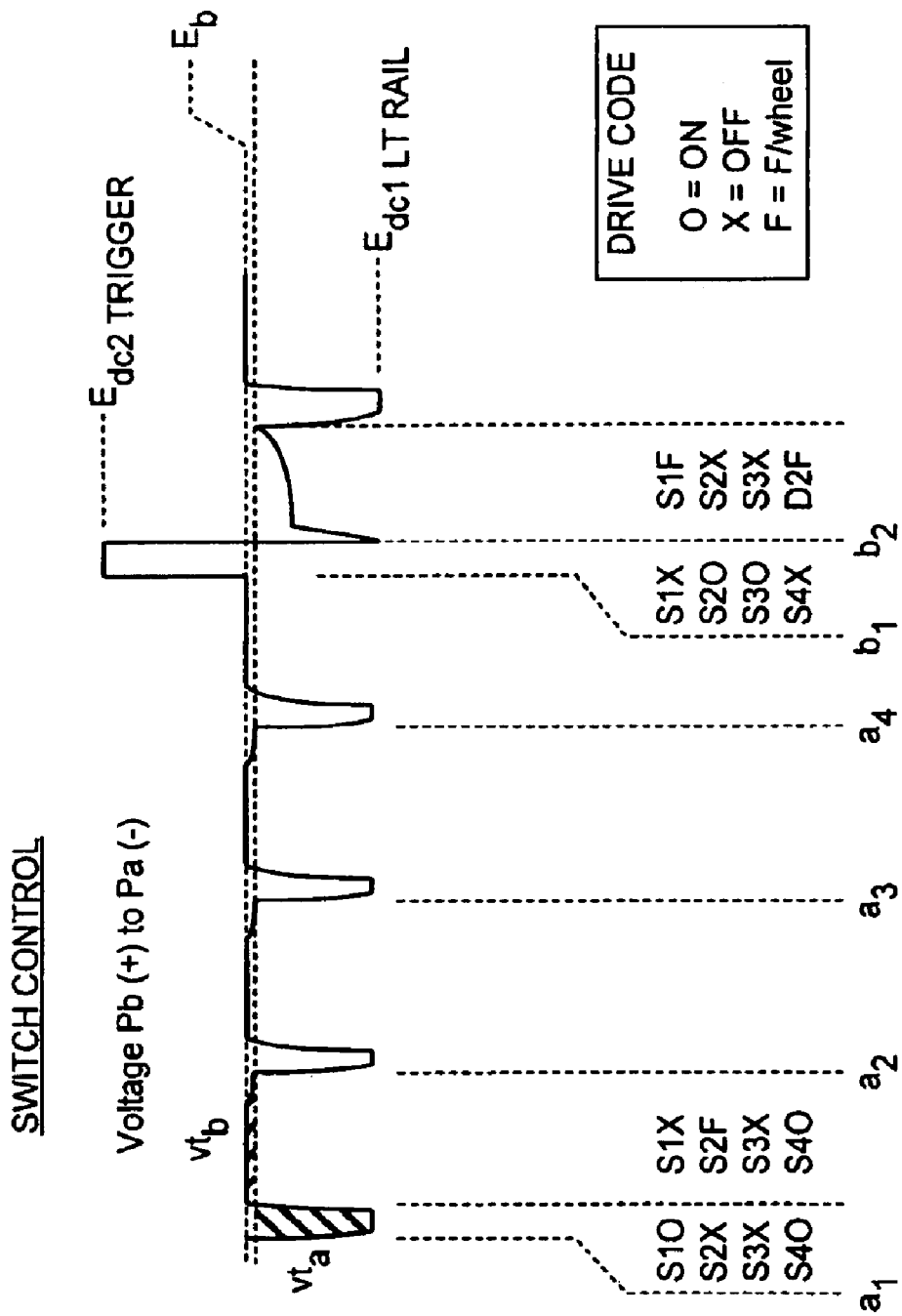
FIG. 3 is an explanatory diagram relating to the operation of the circuit shown in FIG. 2.

With reference to FIG. 3, this illustrates the sequence of operation of the switches S1 to S4 to obtain the required voltage on the LT lines 10 of the modules and the generation of a trigger pulse to be applied via line 9 to the switch 7.

To obtain the LT supply, switches S1 and S4 are simultaneously energised as shown at time $a_1$ and ten during at time $a_2$ switch S1 is turned off.

For production of the LT supply pulse, as resistor R1 is by-passed by diode D1, this permits voltage Edc1 at 19 to be significantly lower than voltage Edc2 on rail 21. The pulse shape degrades but this is not significant as energy is only required to be delivered by the pulses to the modules' LT circuitry. A resistor R2 connected between switch S4 and the ground rail 20 acts as a current source limit such that current through the loop is controlled to a desired value.

To obtain a trigger pulse, at time $b_1$, switches S3 and S2 are simultaneously energised whilst S1 and S4 are off.

When trigger pulses are not required, the negative pulses are pulsed on continuously to maintain the required voltage at the module LT rails. The pulsing rate is determined by permitting region Vta to be equal to Vtb, thus ensuring the transformer fully resets. The backswing voltage permitted Eb may be arranged to be, significantly less than Edc2. This thus provides an adequate noise immunity margin. The LT pulses are conveniently of a similar width to the main drive pulses applied to the load. However, if the mean current demands require it, it may be at a higher PRF say 3000 to 10000 pps. The required trigger drive pulses b1 to b2 may be produced at any time, including interrupting the LT cycle pulses. To enable this to be achieved, the transformers should have a flux capability of twice the VT product required for a single pulse.

In this embodiment, all of the switches S1 to S4 are FETs and optical bootstrap style drives are used for switches S1 and S3. Edc2 is about 800 volts and Edc1 is about 100 volts.

Shielding 22 is provided around the transmission line, being interrupted at its mid-point and each half of the shielding 22 being connected to a resistor R3 and R4, which may be common to both parts of the shielding 22. The electrostatic screen 22 is fitted over the primary loop 18, with a break at the D1, R1 junction at its mid-point to ensure that any displacement currents are diverted into resistors R3 and R4. The shielding 22 is an outer part of a coaxial structure. It does not couple the triggering pulses but serves to shield the inner transmission line from displacement currents. Resistors R3 and R4 are arranged to match the characteristic impedance of the structure formed by the screen 22 and the inner loop 18 such that any current is dissipated during the switching edges of the pulses without further ringing. This impedance match is not directly associated with trigger provision.

The invention may be applicable to, for example, medical linac applications. For such applications, the average power required is low. Thus, it may only be necessary to control the negative pulses to top up the module LT rails to pulse at the normal operating PRF of the main pulses applied to the load. The use of two transformers, the Tna and Tnb arms, gives common mode cancellation of interference currents.

I claim:

1. A switching arrangement adapted to switch a load on and off, the switching arrangement comprising a plurality of modules, to each of which signals are to be applied, each module carrying two current transformer secondary windings and there being a primary transformer loop in the form of a transmission line which is common to each module and which couples with the two transformer windings of each module.

2. The arrangement as claimed in claim 1 wherein the primary transformer loop comprises a coaxial line.

3. The arrangement as claimed in claim 1 wherein the two current transformer secondary windings on a module have an equal number of opposite turns and are connected in parallel.

4. The arrangement as claimed in claim 1 wherein each module is associated with a solid state switch to which trigger signals are applied via the transmission line.

5. The arrangement as claimed in claim 4 wherein the solid state switches are connected to provide a voltage output of tens of kilovolts.

6. The arrangement as claimed in claim 1 wherein the transmission line includes a load resistor.

7. The arrangement as claimed in claim 6 wherein the load resistor is located at substantially the mid-point of the transmission line.

8. The arrangement as claimed in claim 6 wherein a by-pass diode is connected in parallel with the load resistor.

9. The arrangement as claimed in claim 1 and including means for transmitting a current from one source along the transmission line to provide power for local low tension on each module and from another source along the transmission line to apply triggering pulses to the modules.

10. The arrangement as claimed in claim 9 wherein the current applied from one source is in the opposite direction along the transmission line to that applied from the other source.

11. The arrangement as claimed in claim 1 and including electrostatic shielding around part of the length of the transmission line.

12. The arrangement as claimed in claim 11 wherein there is a break in the electrostatic shielding at substantially the mid-point of the transmission line.

13. The arrangement as claimed in claim 11 and including a resistive load connected to the electrostatic shielding.

14. A switching arrangement adapted to switch a load on and off, the switching arrangement comprising:
   a plurality of switching modules to which signals are applied, each module having two separate current transformer secondary windings; and
   a transmission line forming a primary transformer loop, said transmission line being common to each of the current transformer secondary windings of each of said plurality of switching modules.

15. The switching arrangement as claimed in claim 14, wherein said primary transformer loop comprises a coaxial line.

16. The switching arrangement as claimed in claim 14, wherein said two separate current transformer secondary windings of each of said switching modules have an equal number of turns in opposed directions and are connected in parallel.

17. The switching arrangement according to claim 14, wherein each of said switching modules has an associated solid state switch for application of trigger signals via the transmission line.

18. The switching arrangement according to claim 14, wherein the transmission line includes a load resistor.

19. The switching arrangement according to claim 18, wherein the load resistor is located at substantially the mid-point of the transmission line.

20. The switching arrangement according to claim 18, comprising a by-pass diode connected in parallel with the load resistor.

21. The switching arrangement according to claim 14, further comprising:
   at least two direct current power sources; and
   a plurality of switches adapted to couple one of said at least two power sources to said transmission line at any given time.

22. A switching arrangement adapted to switch a load on and off, the switching arrangement comprising:
   a plurality of switching modules to which signals are applied, each module having a first current transformer secondary winding and a second current transformer secondary winding, wherein said first and second current transformer secondary windings have an equal number of turns and the turns of the first current transformer secondary winding extend in a direction opposite to the direction of the turns of said second current transformer secondary winding, and wherein said first and second current transformer secondary windings are connected in parallel; and
   a transmission line forming a primary transformer loop, said transmission line being common to each of said first and second current transformer secondary windings of each of said plurality of switching modules.

23. The switching arrangement according to claim 22, wherein said primary transformer loop comprises a coaxial line.

24. The switching arrangement according to claim 22, wherein each of said plurality of switching modules is associated with a solid state switch to which trigger signals are applied via the transmission line.

25. The switching arrangement according to claim 24 comprising electrostatic shielding around part of the length of said transmission line.

26. The switching arrangement according to claim 25, wherein said transmission line shielding has a break substantially at the mid-point of said transmission line.

27. The switching arrangement according to claim 25, comprising a resistive load connected to said electrostatic shielding.

28. The switching arrangement according to claim 1, further comprising:
   at least two direct current power sources; and
   a plurality of switches adapted to couple one of said at least two power sources to said transmission line at any given time.

29. The switching arrangement according to claim 22, wherein said transmission line includes a load resistor.

30. The switching arrangement according to claim 22, further comprising:
   at least two direct current power sources; and
   a plurality of switches adapted to couple one of said at least two power sources to said transmission line at any given time.

* * * * *